United States Patent [19]
Khandros et al.

[11] Patent Number: 5,347,159
[45] Date of Patent: Sep. 13, 1994

[54] SEMICONDUCTOR CHIP ASSEMBLIES WITH FACE-UP MOUNTING AND REAR-SURFACE CONNECTION TO SUBSTRATE

[75] Inventors: Igor Y. Khandros, Peekskill; Thomas H. Distefano, Bronxville, both of N.Y.

[73] Assignee: Tessera, Inc., Elmsford, N.Y.

[21] Appl. No.: 765,928

[22] Filed: Sep. 24, 1991

Related U.S. Application Data

[63] Continuation-in-part of Ser. No. 673,020, Mar. 21, 1991, Pat. No. 5,148,265, which is a continuation-in-part of Ser. No. 586,758, Sep. 24, 1990, Pat. No. 5,148,266.

[51] Int. Cl.$^5$ ...................... H01L 23/02; H01L 23/12
[52] U.S. Cl. ...................................... 257/692; 257/696
[58] Field of Search ............... 257/692, 694, 695, 696, 257/690, 700, 698, 693

[56] References Cited

U.S. PATENT DOCUMENTS

| | | |
|---|---|---|
| 4,189,825 | 2/1980 | Robillard et al. . |
| 4,751,482 | 6/1988 | Fukuta et al. . |
| 4,772,936 | 9/1988 | Reding et al. . |
| 4,811,082 | 3/1989 | Jacobs et al. . |
| 4,926,241 | 5/1990 | Carey . |
| 4,954,878 | 9/1990 | Fox et al. ............................ 357/81 |
| 4,967,261 | 10/1990 | Niki et al. . |
| 5,289,346 | 2/1994 | Carey et al. . |

FOREIGN PATENT DOCUMENTS

| | | |
|---|---|---|
| 072673A3 | 8/1982 | European Pat. Off. . |
| 072673A2 | 8/1982 | European Pat. Off. . |
| 080041 | 9/1982 | European Pat. Off. . |
| 413451 | 7/1990 | European Pat. Off. . |
| 2495839 | 12/1981 | France . |
| 8910005 | 10/1989 | PCT Int'l Appl. . |
| 9112706 | 8/1991 | PCT Int'l Appl. . |

OTHER PUBLICATIONS

IBM Technical Disclosure Bulletin entitled "Non-Permanent Mounting Technique for Test and Burn-In of C$_4$ Devices", Nov. 1990, vol. 33, No. 7.
IBM Technical Disclosure Bulletin, entitled "Extended Pad for Testing Package Parts", Dec. 1984, vol. 27, No. 7B.
IBM Technical Disclosure Bulletin entitled "Test and Repair of Direct Chip Attach Modules", Aug. 1988, vol. 31, No. 3.

Primary Examiner—Rolf Hille
Assistant Examiner—S. V. Clark
Attorney, Agent, or Firm—Lerner, David, Littenberg, Krumholz & Mentlik

[57] ABSTRACT

A semiconductor chip having contacts on a front face is provided with a flexible, sheet-like backing element overlying the rear face. Terminals on the backing element are connected to the contacts by leads extending alongside the edges of the chip. The backing element desirably is formed integrally with flaps extending from edges of the backing element, and the leads desirably extend along these flaps. The flaps may be bent upwardly so as to bring the leads to the vicinity of the contacts on the chip. Preferably, the backing element and flaps are preassembled to a box-like element with the backing element overlying the bottom of the box and the flaps extending upwardly along the sides of the box so that the extremities of the leads on the flaps are positioned adjacent the top opening of the box for connection to contacts on a chip inserted into the box. A compliant layer most preferably is provided between the terminals on the backing element and the chip.

27 Claims, 6 Drawing Sheets

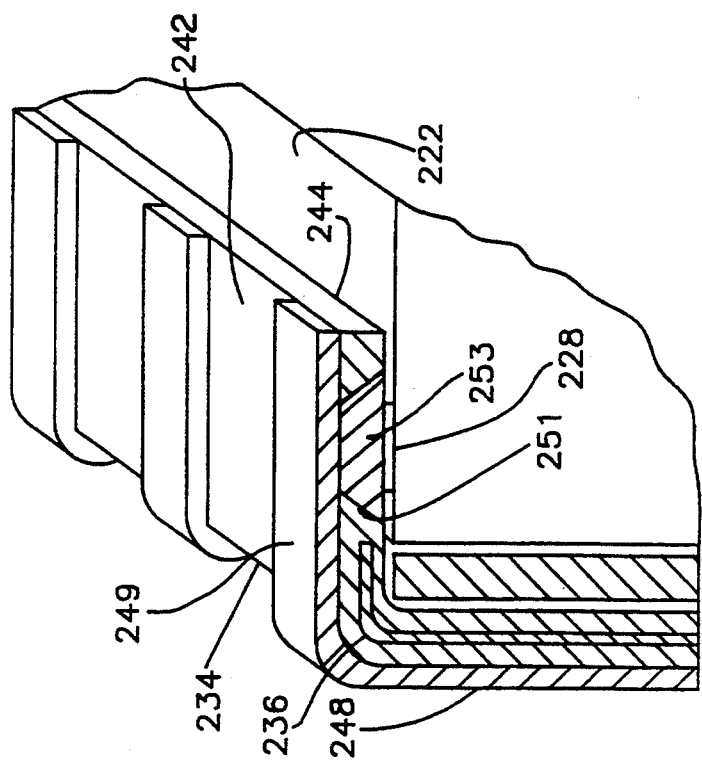
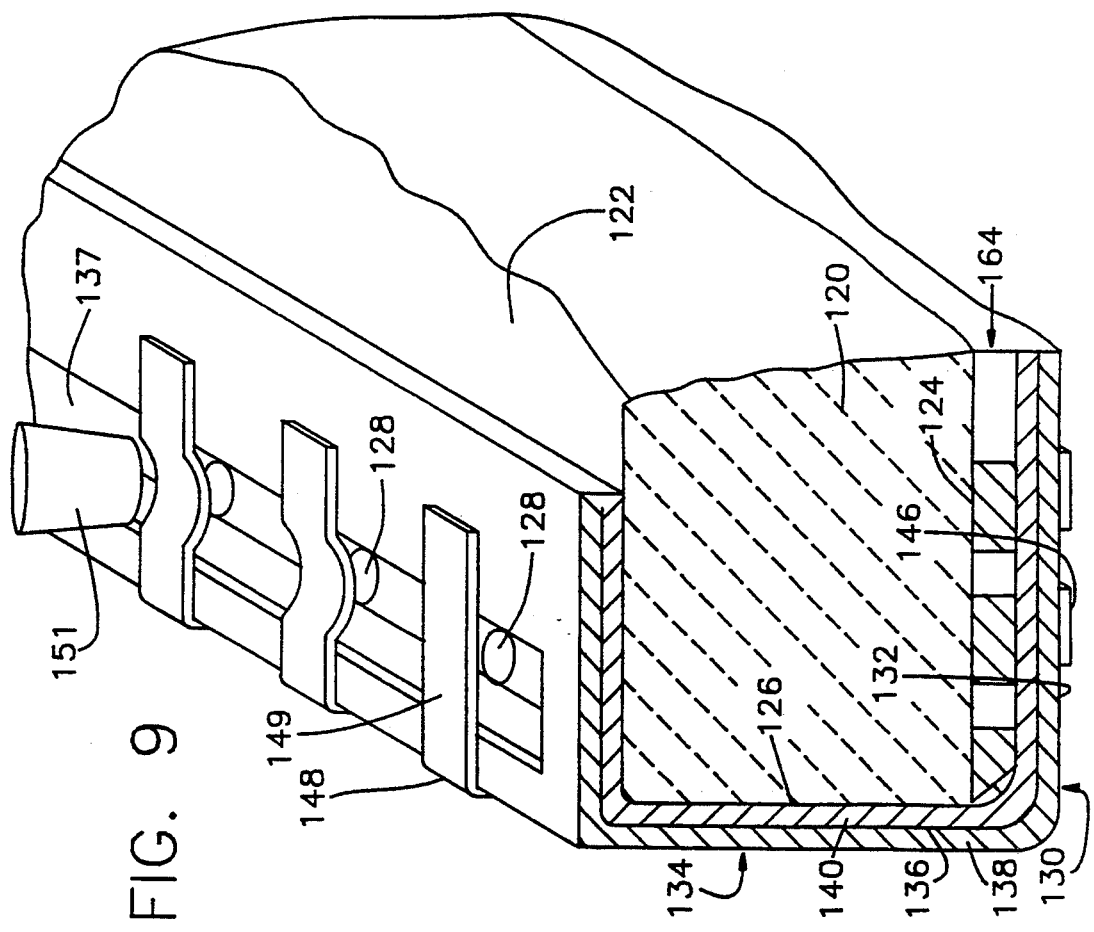

SEMICONDUCTOR CHIP ASSEMBLIES WITH FACE-UP MOUNTING AND REAR-SURFACE CONNECTION TO SUBSTRATE

CROSS-REFERENCE TO RELATED APPLICATIONS

This application is a continuation-in-part of 07/673,020, filed Mar. 21, 1991, now U.S. Pat. No. 5,148,265, which in turn is a continuation-in-part of U.S. patent application Ser. No. 07/586,758, filed Sep. 24, 1990, now U.S. Pat. No. 5,148,266. The disclosure of both of said U.S. patent applications Ser. Nos. 07/673,020 and 07/586,758 is hereby incorporated by reference herein.

BACKGROUND OF INVENTION

The present invention relates to the art of electronic packaging, and more specifically to assemblies incorporating semiconductor chips and to methods of making such assemblies.

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. Moreover, the size of each assembly controls the required distance between each chip and other chips, or between each chip or other elements of the circuit. Delays in transmission of electrical signals between chips are directly related to these distances. These delays limite the speec of operation of the device. For example, in a computer where a central processing unit operates cyclically, signals must be interchanged between the central processing unit chip and other chips during each cycle. The transmission delays inherent in such interchanges often limit the cycling rate of the central processing chip. Thus, more compact interconnection assemblies, with smaller distances between chips and smaller signal transmission delays can permit faster operation of the central processing chip.

The first level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses are applied repeatedly with repeated operation of the device, and can cause breakage of the electrical interconnections. Thermal cycling stresses may occur even where the chip and substrate are formed from like materials having similar coefficients of thermal expansion, because the temperature of the chip may increase more rapidly than the temperature of the substrate when power is first applied to the chip.

The cost of the chip and substrate assembly is also a major concern. All these concerns, taken together, present a formidable engineering challenge. Various attempts have been made heretofore to provide primary interconnection structures and methods to meet these concerns, but none of these is truly satisfactory in every respect. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern, The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate.

Wire bonding ordinarily can only be employed with contacts at the periphery of the chip. It is difficult or impossible to make connections with contacts at the center of the front surface of the chip using the wire bonding approach. In conventional wire bonded assemblies, the area of the substrate occupied by the chip, the wires and the contact pads of the substrate is substantially greater than the surface area of the chip itself.

In tape automated bonding, a polymer tape is provided with thin layers of metallic material forming conductors on a first surface of the tape. These conductors are arranged generally in a ring-like pattern and extend generally radially, towards and away from the center of the ring-like pattern. The chip is placed on the tape in a face down arrangement, with contacts on the front surface of the chip confronting the conductors on the first surface of the tape. The contacts on the chip are bonded to the conductors on the tape. Ordinarily, numerous patterns of conductors are arranged along the length of the tape and one chip is bonded to each of these individual patterns, so that the chips, once bonded to the tape, can be advanced through successive work stations by advancing the tape. After each chip is bonded to the metallic conductors constituting one pattern, the chip and the immediately adjacent portions of the pattern are encapsulated and the outermost portions of the metallic conductors are secured to additional leads and to the ultimate substrate. Tape automated bonding can provide the assembly with good resistance to thermal stresses, because the thin metallic leads on the tape surface are quite flexible, and will bend readily upon expansion of the chip without imposing significant stresses at the juncture between the lead and the contact on the chip. However, because the leads utilized in tape automated bonding extend outwardly in a radial, "fan out" pattern from the chip, the assembly is much larger than the chip itself.

In flip-chip bonding, contacts on the front surface of the chip are provided with bumps of solder. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it is difficult to test and operate or "burn-in" chips having an area array of contacts before attaching the chip to the substrate. Additionally, flip-chip bonding ordinarily requires that the contacts on the chip be arranged in an area array to provide adequate spacing for the solder bumps. Flip-chip bonding normally cannot be applied to chips originally designed for wire bonding or tape automated bonding, and having rows of closely spaced contacts on the periphery of the chip.

Our own prior U.S. patent application Ser. No. 07/586,758 discloses improvements in semiconductor chip assemblies and methods of making the same. As more fully set forth in the '758 application, a semiconductor chip can be connected to a substrate using a sheet-like, and preferably flexible, interposer. The interposer overlies the top, contact-bearing surface of the chip. A first surface of the interposer faces towards the chip whereas a second surface faces away from the chip. Electrical terminals are provided on the second surface of the interposer, and the interposer is also provided with apertures extending through it. Flexible leads extend through these apertures between contacts on the chip and the terminals on the second surface of the interposer. The terminals can be bonded to a substrate. Because the terminals are movable relative to the contacts on the chip, the arrangements described in the '758 application provide excellent resistance to thermal cycling. The interposer disclosed in the '758 application may include a soft, compliant layer disposed between the terminals and the chip. Because the terminals can be disposed in the area of the interposer overlying the contact pattern area of the chip, the structures described in the '758 application provide extraordinarily compact assemblies, substantially as compact as those achieved by flip-chip bonding. The invention described in the '758 application can be used with substantially any chip configuration, including so-called peripheral contact chips having contacts arranged in rows adjacent the periphery of the chip, as well as so-called area array chips having contacts disposed in an array substantially covering the entire face of the chip.

Our earlier filed U.S. patent application Ser. No. 07/673,020 discloses further improvements. The '020 application discloses enhanced forms of interposers which are arranged to be positioned on the top or front surface, i.e., the contact bearing surface of the chip and which can be disposed between the chip and a substrate. Certain interposers disclosed in the '020 application are particularly well suited for use with chips having peripheral contacts. The '020 application also discloses certain chip assemblies incorporating sheet-like interposer structures referred to as "backing elements". The backing element is adapted to underlie the bottom or rear surface of a chip. Terminals on the backing element face downwardly, away from the chip. These terminals are connected by leads to contacts on the front or top surface of the chip. However, there are still further needs for improvements in semiconductor chip assemblies and in the methods utilized to make the same.

SUMMARY OF THE INVENTION

One aspect of the present invention provides a semiconductor chip assembly. A semiconductor chip assembly in accordance with this aspect of the invention desirably includes a semiconductor chip having oppositely facing front and rear surfaces with edges extending between these surfaces, the chip having contacts on the front surface. The assembly further includes a generally sheet-like backing element underlying the chip, the backing element having the top surface facing toward the chip and the bottom surface facing away from the chip. A central region of the backing element is aligned with the chip. The backing element is provided with terminals. At least some, and preferably all of the terminals on the backing element are disposed in the central region, so that the terminals underlie the bottom surface of the chip. The assembly in accordance with this aspect of the present invention further includes electrically conductive leads interconnecting the contacts on the chip front surface with the terminals on the backing element, these leads extending alongside the edges of the chip. Preferably, the backing element and the leads are flexible so that the terminals on the backing element are moveable with respect to the chip and desirably with respect to one another as well. Thus, the terminals desirably are moveable with respect to the contacts on the front surface of the chip. The backing element and leads provide for connection to the chip at the back surface, so that the chip can be mounted in face-up disposition on a substrate. However, because the terminals on the backing element are disposed in the central region and aligned with the chip itself, the connections to the substrate can be made in the area beneath the chip. Therefore, the assembly need not be substantially larger than the chip itself.

The ability to accommodate relative movement between the chip and the terminals on the backing element allows the assembly to accommodate differential thermal expansion between the chip and substrate. Desirably, the terminals on the backing elements are moveable relative to the chip in directions towards the bottom surface of the chip, and the assembly includes resilient means for opposing movement of the terminals towards the bottom surface. For example, the assembly may incorporate a layer of a compliant material disposed between the chip rear surface and the terminals as, for example, a compliant layer formed separately from the backing element and disposed between the backing element and the chip rear surface, or a similar compliant layer incorporated in the backing element itself. The resilience provided to the terminals allows for simultaneous engagement of the terminals on the backing element with multiple test probes and hence permits efficient electrical testing of the assembly.

Most desirably, the assembly includes at least one generally sheet-like flap connected to the backing element. Each such flap extends upwardly, towards the front surface of the chip and away from the backing element alongside one edge of the chip. Each of the aforementioned leads desirably includes a flap portion extending along one of these flaps. The flaps may be formed integrally with the backing element. Desirably, both of the flaps and the backing element include electrically conductive layers and a dielectric layer disposed between the electrically conductive layers and the leads so as to provide a controlled impedance in the leads. Assemblies of this type are especially well suited to use with chips having contacts arranged in rows adjacent the periphery of the chip front surface peripherate. Desirably, each flap extends to the vicinity of at least one row of contacts. The flap portions of the leads on each such flap are connected to the adjacent row of contacts. Such connection may be made for instance by wire bonding or by direct connections between the flap portions of the leads and the contacts on the chip. Even where wire bonding is employed, however, the wires extending between the chip contacts and the flap portions of the leads are short. Such short wire bonds can be readily applied and have relatively low inductance.

Most preferably, the chip assembly includes one or more support elements disposed between the flaps and the edges of the chip. The support elements may cooperatively constitute a ring surrounding the chip and may form the walls of a box. The box may also incorporate a floor element disposed beneath the rear surface of the chip, between the rear surface and the backing element. Where the assembly includes a floor element underlying the chip rear surface, the compliant layer may be disposed between the floor element and the terminals, as, for example, between the floor element and the backing element. These arrangements provide for mechanical support of the flaps and protection of the interconnections. Further protection may be afforded by encapsulating the assembly.

Further aspects of the invention provide components incorporating subassemblies of the backing element, leads and support element. Preferably, these components include support elements defining a box, and include flaps integral with the backing element extending upwardly along the sides of the box. The conductors extending along the flaps are prepositioned adjacent the top edges of the box walls. In manufacture of the assembly, the chip may be placed within the box and the conductors may be joined to the chip terminals.

Assemblies as discussed above may be incorporated in a larger assembly with a substrate having contact pads, the contact pads of the substrate being aligned with the terminals on the backing element and connected thereto. Such connection may be made for example by masses of electrically conductive bonding material disposed between the terminals and the contact pads of the substrate.

The present invention also includes methods of making circuit assemblies.

Further aspects, features and advantages of the present invention will be more readily apparent from the detailed description of the preferred embodiments set forth below, taken in conjunction with the accompanying drawings.

BRIEF DESCRIPTION OF THE DRAWINGS

FIGS. 9 and 10 are fragmentary, partially sectional perspective views depicting components in accordance with additional embodiments of the invention.

DETAILED DESCRIPTION OF THE PREFERRED EMBODIMENTS

Figure 1:
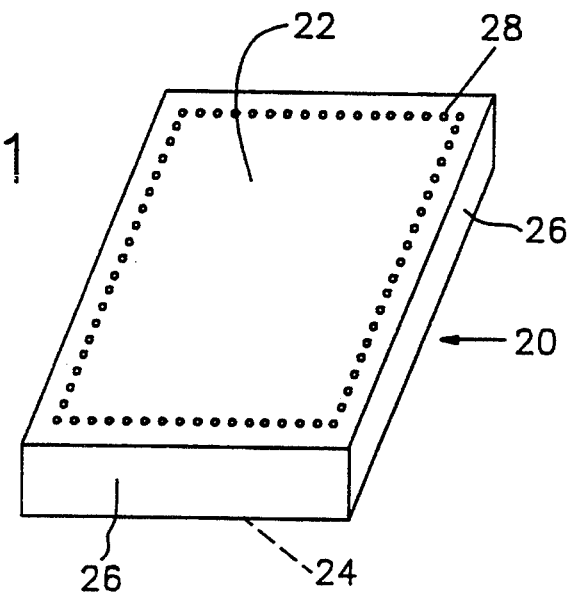
FIG. 1 is a diagrammatic perspective view of a semiconductor chip used in one embodiment of the invention.

As illustrated in FIG. 1, a semiconductor chip 20 used in one embodiment of the invention is a generally rectangular, solid mass having a top or front face 22, a rear or bottom face 24 and edges 26 extending between these faces. The chip incorporates microelectronic components (not shown) in the conventional fashion, the nature and arrangement of these components depending upon the particular function to be performed by the chip. The chip also has contacts 28 on front surface 22, the contacts being arranged in rows adjacent the edges of the chip and extending generally parallel thereto.

Figure 2:
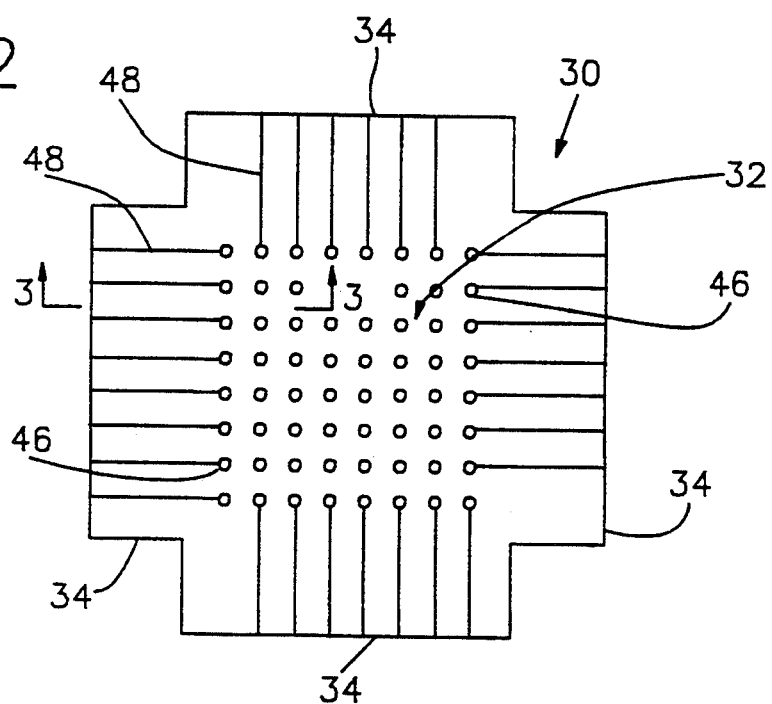
FIG. 2 is a diagrammatic plan view of a component used with the chip of FIG. 1.
Figure 3:
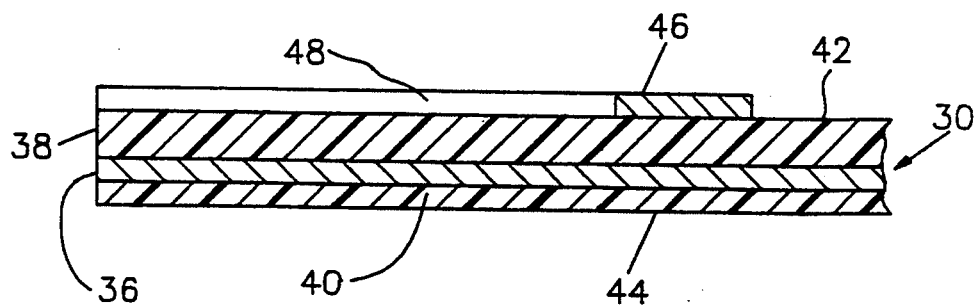
FIG. 3 is a fragmentary sectional view on an enlarged scale taken along lines 3—3 in FIG. 1.

As illustrated in FIGS. 2 and 3, a connection component 30 for use with such a chip includes a generally cruciform, unitary sheet comprising a generally rectangular backing element 32 and flaps 34 projecting from the edges of the backing element. The sheet has a layered structure including a conductive layer 36, an insulating layer 38 and a further insulating layer 40 on the opposite side of conductive layer 36. Layer 38 defines a first surface 42 of the connection component, whereas layer 40 defines a second surface 44. A set of terminals 46 are disposed on the first surface 42 of the connection component in a central region of the backing element 32. These terminals may be disposed in a rectilinear, grid-like array. Although only a few terminals are illustrated in FIG. 2 for clarity of illustration, several hundred terminals may be provided on a typical component.

Leads 48 are also formed on the first surface 42 of connection component 30, each such lead being formed integrally with one terminal 46 and electrically connected thereto. Leads 48 extend outwardly, away from backing element 32 on flaps 34, and project to the edges of the flaps. Thus, each such lead 48 includes a flap portion extending along the associated flap, and a central portion extending from the inner margin of the flap to the associated terminal 46. The thickness of the various layers constituting connection component 30 is greatly exaggerated in FIG. 3 for clarity of illustration. In practice, each of these layers has the minimum thickness required to meet electrical requirements. Desirably, insulating layers 38 and 40 have the minimum thickness required to provide freedom from pinholes and breaks in the insulation, whereas conductive layer 36 and leads 48 have the minimum thickness required for electrical continuity and to provide a relatively low resistance current path. Preferably, each of the insulating layers is less than about 0.5 mm thick, and more preferably, less than about 0.25 mm thick, whereas conductive layer 36 preferably is less than about 0.1 mm thick and each of leads 48 preferably is less than about 0.1 mm thick. Connection component 30 may be formed from substantially the same materials, and in substantially the same manner, as the tape used for tape automated bonding processes. Thus, insulating layers 38 and 40 may incorporate conventional polymeric dielectric materials such as polyimide, whereas layer 36, conductors 48 and terminals 46 may be formed from copper or other metals. The pattern of terminals and conductors may be formed by photochemical etching or deposition techniques similar to those used in the manufacture of tape automated bonding tapes and flexible printed circuits.

Figure 4:
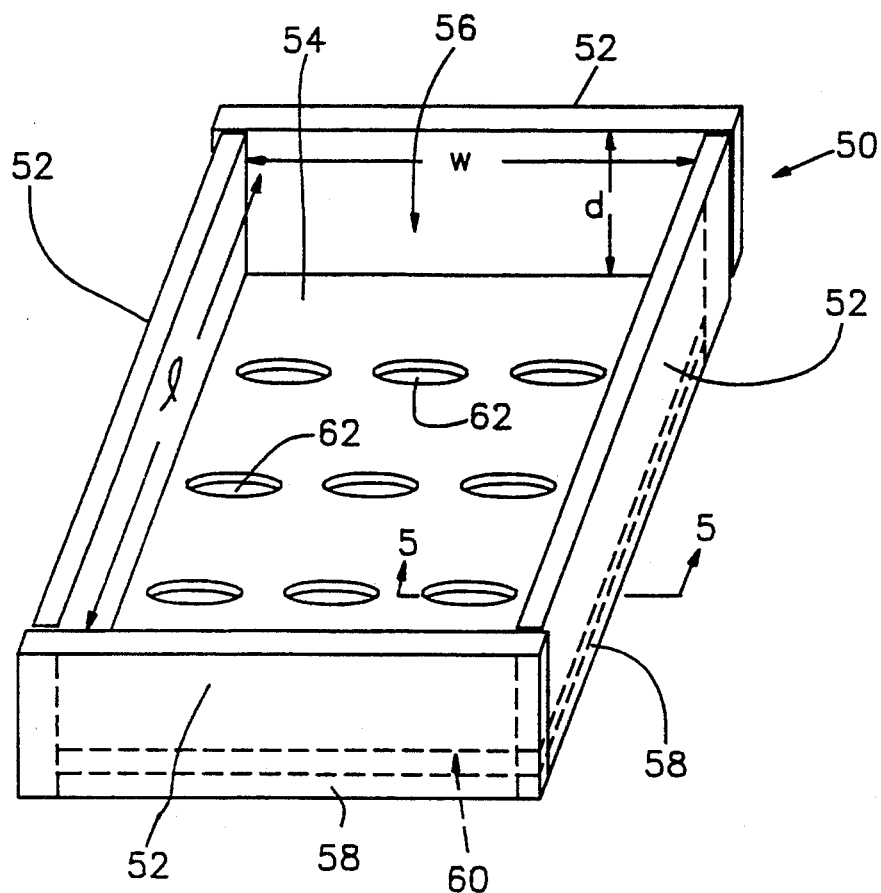
FIG. 4 is a diagrammatic perspective view of a further component used with the components of FIGS. 1-3.
Figure 5:
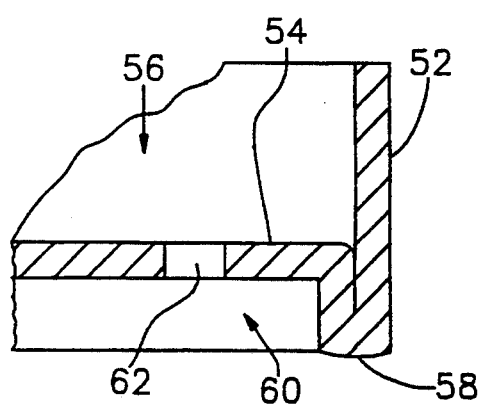
FIG. 5 is a fragmentary sectional view taken along lines 5—5 in FIG. 4.

Component 30 may be used with a box-like element 50 shown in FIGS. 4 and 5. Box element 50 includes four support elements or walls 52 arranged to form a generally rectangular ring and a floor element 54 extending across the interior of this ring so that walls 52 and floor element 54 cooperatively define a rectilinear closed-bottom box having an interior space 56 open at the top (the side visible in FIG. 4). The box has length l and width w slightly larger than the corresponding dimensions of chip 20, whereas the depth d of the box desirably is slightly greater than the thickness of chip 20, i.e., slightly greater than the distance between surfaces 22 and 24 of the chip. Each support member or wall 52 has a projection 58 extending downwardly, beneath floor element 54, so that projections 58 and floor element 54 cooperatively define a further open interior space 60 on the bottom side of floor element 54. The floor element has several holes or apertures 62 extending through it, between spaces 56 and 60. Space 60 is shallower than space 56. Box element 50 may be formed from substantially rigid materials such as thermoplastics or thermosetting polymers, glass, ceramics, glass-ceramic materials, polymer-matrix composites, metal-matrix composites and metals, metals and polymers being preferred.

In a fabrication process according to one aspect of the invention, a resilient, compliant layer 64 (FIG. 6) formed from a relatively low elastic modulus material is provided in the lower or downwardly facing space 60 of box element 50. Preferably, this low-modulus material has elastic properties (including modulus of elasticity) comparable to those of soft rubber, about 20 to about 70 Shore A durometer. Compliant layer 64 has holes 66 interspersed with masses 68 of the low modulus material. Layer 64 may be formed from a sheet of solid elastomer by punching or perforating to form holes 66, and then inserted into the lower space 60 of box element 50 and fastened in place by adhesive material 70 extending through holes 62 in the floor element 54 of box element 50. A portion of this adhesive material may partially or fully coat the top surface of floor element 54 so as to provide some degree of surface adhesion or tack on the top surface of the floor element. Alternatively, compliant layer 64 may be formed by molding in place within the lower space of the box element. Thus, the elastomeric material may be introduced in a fluid condition and chemically or heat cured to a resilient state. Where the compliant layer 64 is formed in this fashion, some portion of the elastomeric material may protrude through holes 62 in much the same way as adhesive material 70. This serves to fasten the compliant layer to the undersurface of the floor element. The compliant layer may also be applied by silk-screening. In yet another alternative procedure, the compliant layer can simply be placed within the lower space of the box element without fastening it to the box element.

Figure 7:
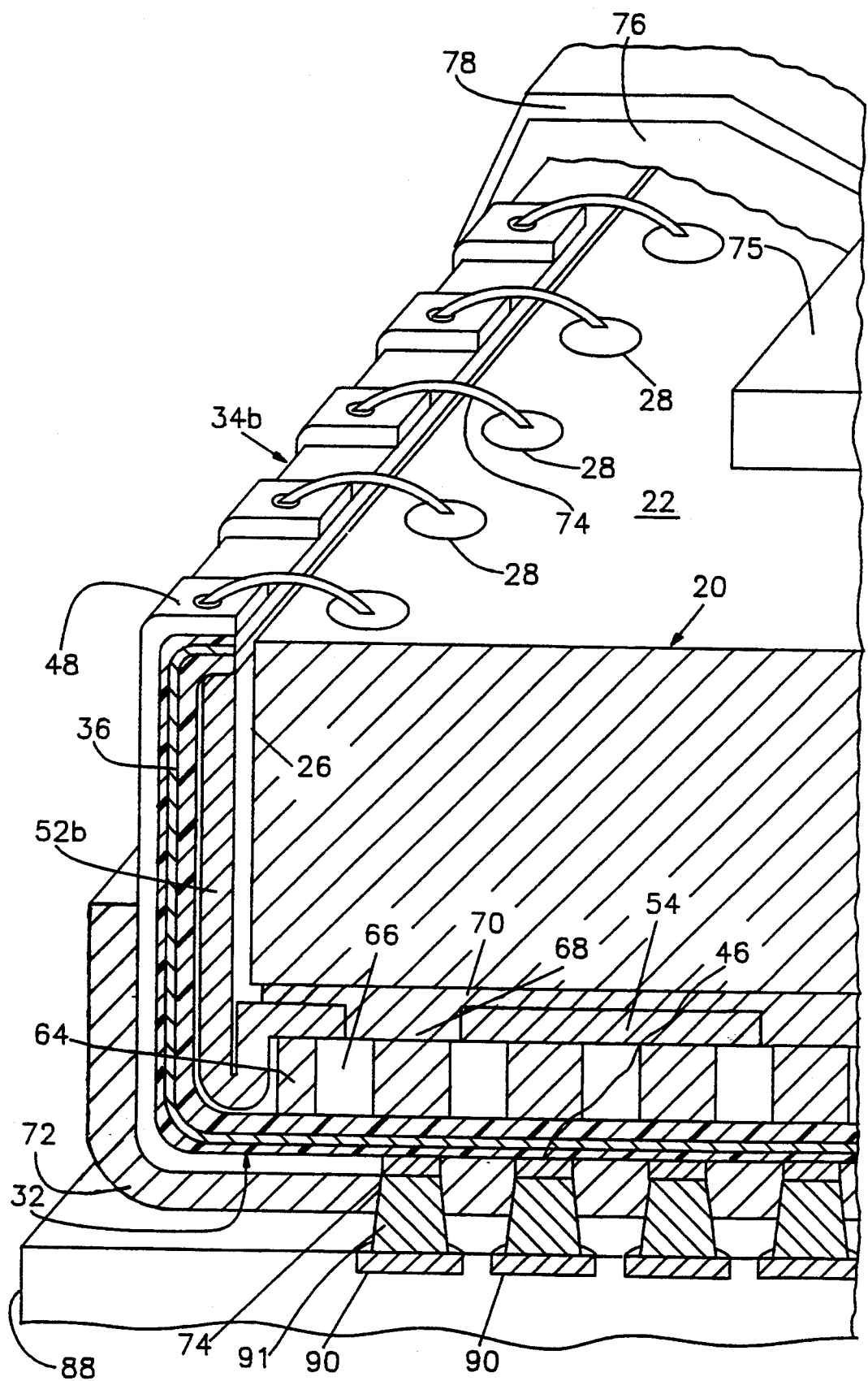
FIG. 7 is a fragmentary, partially sectional perspective view depicting a final assembly incorporating the components of FIGS. 1-6.

In the next stage of the assembly process, connection component 30 is juxtaposed with box element 50 so that the second surface 44 of the connection component confronts the exposed or bottom surface of compliant layer 64, and so that the backing element 32, is aligned with floor element 54 and compliant layer 64. At this stage of the process, each flap 34 of connection component 30 projects outwardly beyond walls 52 and extends across the lower extremity of one projection 58. Thus, the central region of the backing element bearing terminals 46 is aligned with compliant layer 64, the terminals facing downwardly, away from the compliant layer and floor element 54. The arrangement of masses 68 in compliant layer 64 is selected to match the arrangement of terminals 46. As best illustrated in FIG. 7 (showing a later stage of the process) each terminal 46 is aligned with a mass 68 of the low modulus material whereas the holes 66 in layer 64 are aligned with spaces between terminals 46.

Figure 6:
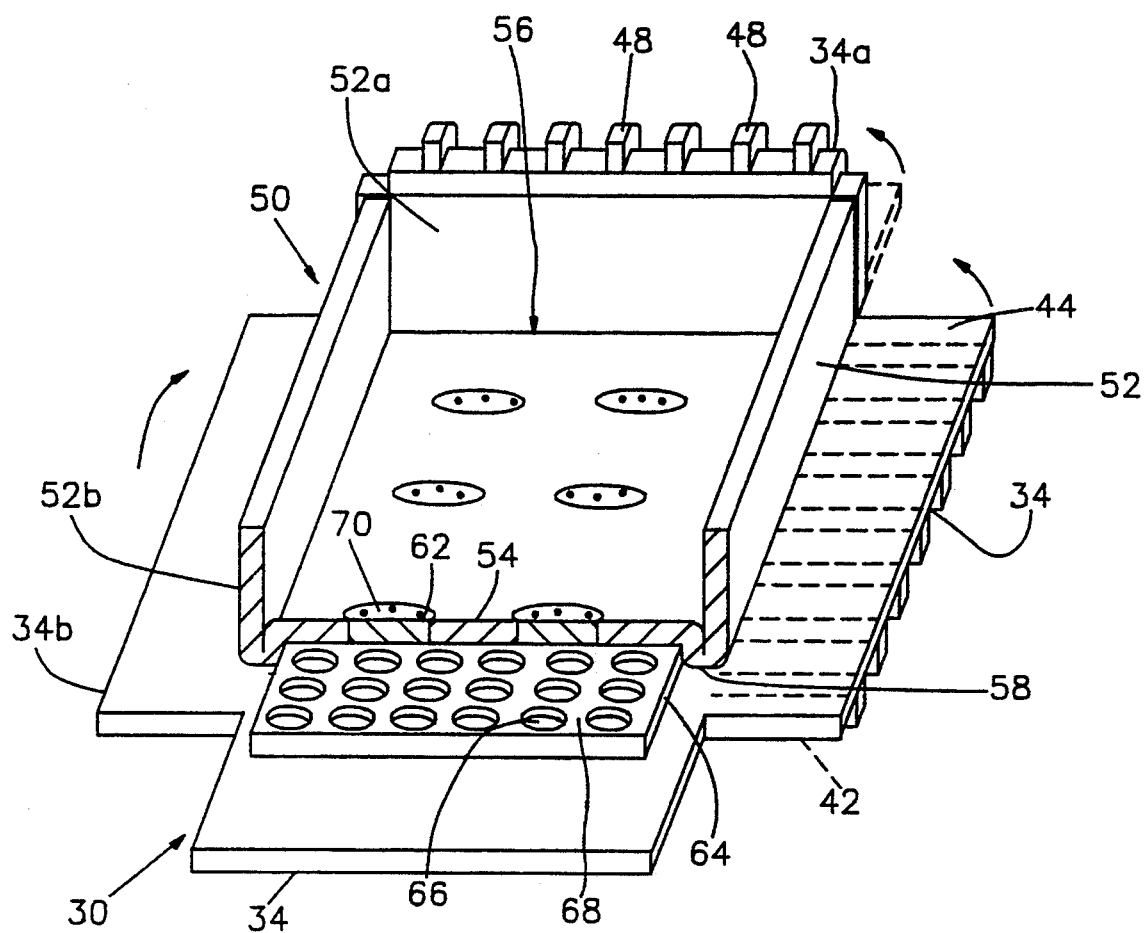
FIG. 6 is a diagrammatic perspective view showing the components of FIGS. 1-5 at an intermediate stage of an assembly process.

In the next stage of the manufacturing process, flaps 34 are bent upwardly alongside the walls or support elements 52 of box element 50. Thus, each flap 34 and the flap portions 48 of the conductors on such flap extends upwardly alongside the associated wall 52. The extremity of each flap is bent inwardly over the uppermost margin of the associated wall 52. Thus, as seen in FIG. 6, the extremity of flap 34a is bent inwardly at the upper extremity of wall 52a. Likewise, flap 34b extends upwardly along side wall 52b as illustrated in FIG. 7 and is bent inwardly over the upper most extremity of wall 52b. Thus, the extremities of conductors 48 adjacent the edges of the flaps are disposed along the top edges of walls 52, remote from floor element 54 around the top opening of space 56. Conductors 48 extend downwardly alongside the walls of the box element to terminals 46, which are disposed beneath the box element. As connecting element 30 and hence flaps 34 are flexible, the bending operation can be performed readily. The extremities of the flaps overlying the top edges of walls 50 are bonded to the tops of the walls.

A layer of dielectric material is applied as a solder mask layer 72 covering the downwardly facing first surface of backing element 32. Solder mask layer 72 is provided with apertures 74 aligned with terminals 46 of the backing element. This solder mask layer may be formed by molding or by selective curing of a dielectric material. For example, the material may be applied in a flowable, uncured state and then cured by radiant energy. The radiant energy may be applied selectively so as to cure all portions of the layer except those portions overlying the terminals 46. Subsequent to this selective curing, the uncured portions may be removed. Alternatively, the solder mask may be applied as a solid layer and punctured to expose terminals 46. As discussed further hereinbelow, solder mask layer 72 and may be omitted in certain cases.

The assembly at this stage constitutes a receptacle adapted to receive a semiconductor chip. These receptacles can be prefabricated in mass production and distributed to semiconductor chip manufacturers and users. Alternatively, the receptacle can be fabricated immediately before it is united with the semiconductor chip.

The receptacle is united with a semiconductor chip 20 by first placing chip 20 into the top or upper space 56 of box element 50, so that the front face 22 of the chip faces upwardly, away from floor element 54 and backing element 32. The chip 20 may be temporarily retained in position within the receptacle by the adhesive 70 on the top surface of floor element 54. In this position, the edges 26 of the chip confront the support elements or walls 52 of the box element. Flaps 34, and hence lead portions 48 on the flaps, extend upwardly along side edges 26 of the chip, so that the leads on each such flap extend to the vicinity of one row of contacts 28 on the chip. Each row of contacts 28 is positioned immediately adjacent to the extremities of leads 48 on one of flaps 34. The front surface 22 of the chip, and hence contacts 28, are disposed at substantially the same height above floor element 54 as are the extremities of leads 48.

While the chip is in this position, the contacts 28 are electrically connected to leads 48 by wire bonding the contacts to the adjacent extremities of leads. In the wire bonding operation, fine wires 74 are connected between contacts 28 and lead portions 48, thereby electrically connecting each lead portion 48 to one contact 28 in the adjacent row of contacts. In effect, wires 74 merge with lead portions 48 to form a composite lead extending from terminal 28, around one wall element 52 and downwardly alongside the edge 26 of the chip to one terminal 46 on the backing element 32.

The process of wire bonding per se is well known in the electronics art and need not be described in detail herein. Briefly, this process utilizes a movable wire dispensing and bonding head. The head is brought into engagement with one of the elements to be connected and an end of a fine wire is bonded to such element. The head is then moved while paying out the wire until it reaches the other element to be connected, whereupon the wire is bonded to such other element and cut, leaving the wire in place. Wire bonding processes typically are controlled by detecting the relative position and orientation of the components to be connected and then controlling the wiring bonding head accordingly so as to bring the wires into contact with the desired elements. This allows the desired interconnections to be made even where the relative positions of the components to be connected differ from the nominal positions. Typically, the relative positions and orientations of the components are detected by robot vision systems, such as television-based pattern recognition systems. These techniques desirably are used in the wire bonding step of the present method. Where such techniques are employed, it is not essential to provide great precision in the positioning of chip 20 or in the positioning of lead portions 48. This minimizes the need for close control of the bending operation discussed above.

After the bonding wires 74 have been attached, a pad 75 of a soft, thermally conductive material such as a silicone with a thermally conductive filler is placed atop the front surface 22 of the chip. The pad covers the central portion of the chip front surface, remote from contacts 18 and wires 74. A layer of an encapsulant 76 is applied over the front face 22 of the chip. The encapsulant, which desirably is a soft, dielectric material covers the bonding wires 74, the contacts 28 and the extremities of the lead portions 48 disposed atop the walls 52. The encapsulant desirably also penetrates into and at least partially fills spaces between the edges 26 of the chip and the confronting walls 52 of the box element. A cover 78 is then placed over the top of the assembly. Cover 78 may be a box-like metallic element, commonly referred to as a "chip can", or else may be molded in a place on the assembly from a polymeric material such as an epoxy. Cover 78 may be united with the periphery of the solder mass layer 72 so as to seal the assembly against subsequent contamination. Encapsulant 76 contacts the front surface 22 of the chip and also contacts cover 78, thus providing a path for heat transmission from the chip to the cover. This facilitates heat transfer from the chip to the surroundings, outside the assembly, during operation of the chip. Cover 78 also contacts layer 75, further facilitating heat transfer.

Figure 8:
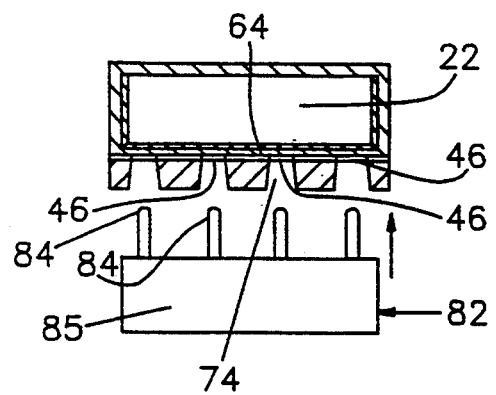
FIG. 8 is a diagrammatic sectional view depicting a test procedure.

The assembly desirably is tested before being used as part of a larger assembly. As schematically illustrated in FIG. 8, the assembly may be engaged with an electrical testing fixture 82 having numerous pins 84 connected to an appropriate test circuit by advancing the test fixture and assembly towards one another so that the pins 84 contact the terminals 46 on the backing element. This forms a temporary electrical connection between each pin 84 of the test fixture and one contact 28 (FIG. 7) of the chip. To provide a reliable test, the numerous pins on the test fixture must be held in contact with the respective terminals 46 at the same time. Due to tolerances in the test fixture and in the assembly itself, one or another of the pins 84 will engage the associated contact 46 before the other pins have engaged their contacts. However, terminals 46 can be displaced towards chip 22. As the test fixture and the assembly move towards one another, the pin 84 which first engages one contact 46 will simply displace that contact towards chip 22. Such displacement permits continued movement of the test fixture and assembly towards one another, until all of the pins are engaged with their respective terminals 46. Each terminal 46 will be biased against the associated pin 84 of the test fixture by the resilience of compliant layer 64. This assures reliable contact and a reliable test. The configuration of compliant layer 64 contributes to this action. Each mass 68 of low modulus material provides backing and support for the terminal 46 aligned therewith. As the pins 84 of the test fixture engage the terminals, each mass 68 is compressed in the vertical direction and therefore tends to bulge in horizontal directions, parallel to the plane of the chip. Holes 66 provides space for such bulging. Compliant layer 64 need only provide for sufficient movement of terminals 46 to accommodate tolerances in the test equipment and in the assembly itself. Typically, about 0.0005 inch (0.125 mm) or less compliance is sufficient. For example, compliant layer 64 may be about 0.008 inch (0.2 mm) thick.

Although test probe set 82 is schematically illustrated in FIG. 8 as including only a few pins 84, the test probe set in fact may include a full complement of pins, equal in number to the number of terminals 46, so that all of terminals 46 can be engaged simultaneously. The pins of test fixture 82 may be rigidly mounted to a common support 85. Therefore, the test fixture may be rugged, reliable and durable. The particular shape of pins 82 is not critical. However, pins 82 may desirably be formed as small metallic spheres solder bonded to support 85. Support 85 in turn may be a ceramic body with appropriate internal leads, similar to a conventional semiconductor mounting substrate. Because the test fixture may make simultaneous connections with all terminals in the assembly, and because the test fixture may have dimensions and configurations similar to a real substrate, the temporary electrical connection made using the test fixture can provide a realistic test. The test fixture need not incorporate long leads which introduce unwanted impedance. Accordingly, the test may involve operation of the chip at full speed. Because the test fixture may be simple and economical, many such fixtures can be provided in a manufacturing plant so that each chip can be tested for a prolonged period.

After testing, the assembly is mounted to a substrate 88 (FIG. 7) having electrical contact pads 90. The assembly is placed on the substrate so that the apertures 74 in solder mass layer 72 and terminals 46 are aligned with the contact pads 90 of the substrate. Masses of an electrically conductive bonding material 91 such as a solder. Masses of an electrically conductive bonding material such as a solder or an electrically conductive adhesive may be disposed between the terminals 46 and the contact pads 90 of the substrate. These masses may be caused to flow and to bond with the terminals and contact pads, thereby forming a mechanical and electrical connections between the terminals and the contact pad. This stage of the process may use essentially the same techniques as are employed in surface mount technology for assembly of components on printed circuit boards.

Because terminals 46 are disposed at substantial center to center distances, these standard surface mount techniques can be used without difficulty. In this regard, it should be appreciated that terminals 46 are distributed over an area approximately equal to the entire area of the chip bottom surface 24. By contrast, contacts 28 of the chip itself are concentrated in rows around the periphery. Thus, the center to center distances between the terminals 46 may be substantially greater than the center to center distances between contacts 28. In typical applications, electrical connections for a chip having a substantial number of input and output terminals, commonly referred to as a "I/O count" can be achieved with 10-25 mil (250-625 micrometer) center to center distances.

The contact pads 90 of the substrate are electrically connected to other elements of an electrical circuit through conventional connections (not shown) incorporated in substrate 88. For example, substrate 88 may be a circuit board, circuit panel or hybrid circuit substrate incorporating various electronic elements. Alternatively, substrate 88 may be provided with pins or other interconnecting devices for mounting substrate 88 to a larger substrate and for electrically connecting contact pads 90 to other electrical devices on that larger substrate. In an alternate arrangement, each of terminals 46 is provided with a micro miniature separable connector component such as a pin or socket, whereas each contact pad on substrate 88 is provided with a mating micro miniature separable connector element.

The solder mask layer can be provided with metal rings surrounding each terminal and defining a preselected area which can be wetted by solder. This confines the solder of each joint to a preselected area. Also, small studs, balls, or pins may be positioned in the holes of the solder mask layer in electrical contact with terminals 46, and these studs may be soldered to a substrate.

The composite leads including lead portions 48 and bond wire 74 provide reliable interconnections between contacts 28 and terminals 46. Because the electrically conductive layer 36 of connecting element 30 extends upwardly, alongside the chip with lead portions 48, lead portions 48 have predictable, controlled impedance. This reliable electrical performance is also enhanced by the predictable geometric configuration of lead portions 48. Each lead portion 48 has a predetermined width and is located in a predetermined position relative to the adjacent lead portions. These relative positions and widths are fixed when the connecting element 30 is made. Although the composite leads do include bonding wires 74, these bonding wires are so short that they have very low inductance.

The assembly thus provides a compact, rugged and economical chip mounting. The entire assembly occupies little more area (in the plane of the chip) than the chip itself. As the leads and flaps extend alongside the chip, in close proximity to the edges of the chip, they do not substantially increase the area occupied by the assembly. Also, because the assembly can be pretested before mounting to the substrate, high quality can be assured. The methods and structure discussed above can be varied in numerous ways. Also, solder mask layer 72 may be applied at any stage in the process. If desired, this layer could be formed as part of connection element 30 or applied after the remaining components of the assembly, as by molding in place so that solder mask layer 32 contacts cover 78.

The configuration of box element 50 can be varied from that illustrated. The floor element 54 can be omitted entirely, or else the floor element may include only small tabs projecting inwardly from the walls 52 so as to support the chip only at its edges or corners. In either case compliant layer 64 will be in direct engagement with the bottom surface of the chip and with the backing element. Alternatively, the holes 62 in the floor element 54 may be omitted. The downward projections 58 of the walls 52 may be omitted, so that the walls terminate flush with the floor element or flush with the bottom surface of the chip if the floor element is omitted. The bottom edges of the walls may be provided with chamfers or radii to prevent damage to the connection component 30 when the flaps are bent upwardly. The box element may be provided with supports, such as legs at the corners of the box element, projecting downwardly for engagement with the substrate. In this case, the box element will serve to support the chip above the substrate, thereby preventing crushing of the solder joints during manufacturing procedures or in use. This arrangement is particularly useful where a heat sink is forcibly held in engagement with the front surface of the chip.

The compliant layer 64 disposed adjacent the backing element can extend outwardly to the outer surfaces of the walls or support elements 52, so that a portion of the compliant layer is interposed between the lower edge of each such wall or support element and backing element 30. This arrangement is particularly useful when some of the terminals 46 are disposed on that portion of the backing element aligned with the bottom edges of the walls.

Where the coefficient of thermal expansion of the box element differs substantially from the coefficient of thermal expansion of the chip, the bonding wires 74 can flex to compensate for relative movement of the chip and the lead portions at the extremities of the flaps, overlying the top edges of the walls. In those cases where the flap portions of leads 48 are bonded directly to the contacts on the chip as discussed below, those flap portions of the leads may be flexible to provide similar compensation. Where the coefficient of thermal expansion of the box element differs substantially from that of the substrate, the backing element preferably is not bonded to the bottom of the box element except through the compliant layer. This permits the flaps to flex and the backing element to move relative to the box element and absorb differential thermal expansion.

The configuration of the heat transfer elements can be varied considerably. Thus, the thermally conductive pad or layer 75 may include a metallic slab bonded to the front or top surface of the chip. Such a metallic heat sink may include fins, plates or projections to further facilitate heat transfer. A plurality of chips can be engaged with the same heat sink. Essentially any heat sink which can be used with conventional face-up chip assemblies can be employed.

The backing element and flaps may include more than one layer of leads, so as to accomodate particularly complex interconnection requirements. Also, more than one flap may be provided at each edge of the backing element, and these multiple flaps may extend in superposed relation along the edge of the chip or along the wall of the box element.

As illustrated in FIG. 9, box element 50 may be omitted. Thus, the flaps 134 of connecting element 130 may be folded upwardly, alongside the edges 126 of chip 120, without intervening wall members. Also, compliant layer 164 may be disposed directly between backing element 132 and the bottom or rear surface 124 of the chip 120, without any intervening floor element. In the arrangement shown in FIG. 9, each flap 134 not only extends upwardly along the side the edge 126 of the chip but also extends inwardly, over a marginal portion of the chip front surface 122 adjacent the edge 126. Each flap has a slot 137 overlying a row of contacts 128 on the chip. The extremities 149 of lead portions 148 extend across this slot and hence overlie the chip contacts 128. In the assembly process, extremities 149 can be bonded directly to terminals 128 by techniques such as thermocompression or ultrasonic bonding, using a tool 151 which enters into slot 137. To facilitate the bonding operation, extremities 149 may be curved in directions parallel to the length of slot 137 so as to permit them to deflect downwardly and engage contacts 128 more readily under the influence of bonding tool 151. The connecting element 130 illustrated in FIG. 9 may be fabricated using deposition or etching techniques similar to those discussed above. As an additional step, the region of insulating layers 138 and 140, and of conducting layer 136 underlying extremities 149 may be removed by etching so as to form slot 137. In the manufacturing process, the connecting element 130 and compliant layer 164 are assembled to chip 120, and the flaps 134 of the connecting element are folded directly upwardly, alongside the edges 126 of the chip. The extremities of flaps are then folded inwardly over the front surface of the chip. The assembly illustrated in FIG. 9 may also be provided with a solder mask layer, housing and encapsulant as discussed above.

The arrangement of FIG. 10 is similar to that discussed above with reference to FIG. 9, in that the extremities of flaps 234 are folded over the front surface 222 of the chip, thereby positioning the extremities 249 of lead portions 248 over contacts 228 on the chip. Here, however, the connecting element includes vias 251 extending through it from beneath each lead extremity 249 to the second surface 244 of the flap, i.e., the surface opposite from the first or lead-bearing surface 242. Each such via is filled with an electrically conductive bonding material such as a thermocompression bonding alloy 253. Bonding material 253 is activated by heat or pressure, using bonding conventional techniques, to bond each lead extremity 249 to one contact 228 on the chip. The electrically conductive layer 236 of the connecting element terminates remote from vias 251, so that the electrically conductive layer does not make an electrical connection with the conductive material 253. If desired, the conductive layer 236 may be extended to one or a few of vias 251 so as to provide a ground connection to layer 236. That is, one of leads 248 may be connected to a terminal (not shown) which in turn is connected to a ground on the substrate, and layer 236 may be grounded through that lead.

As an alternative to thermocompression or other conventional bonding techniques, the leads can be connected to the contacts on the chip by using a so-called "Z-conducting" adhesive. Such materials ordinarily include electrically conductive particles selected so that when the material is applied in a thin layer, it will have appreciable electrical conductivity in the direction through the layer but only insignificant conductivity in directions parallel to the layer.

Figure 11:
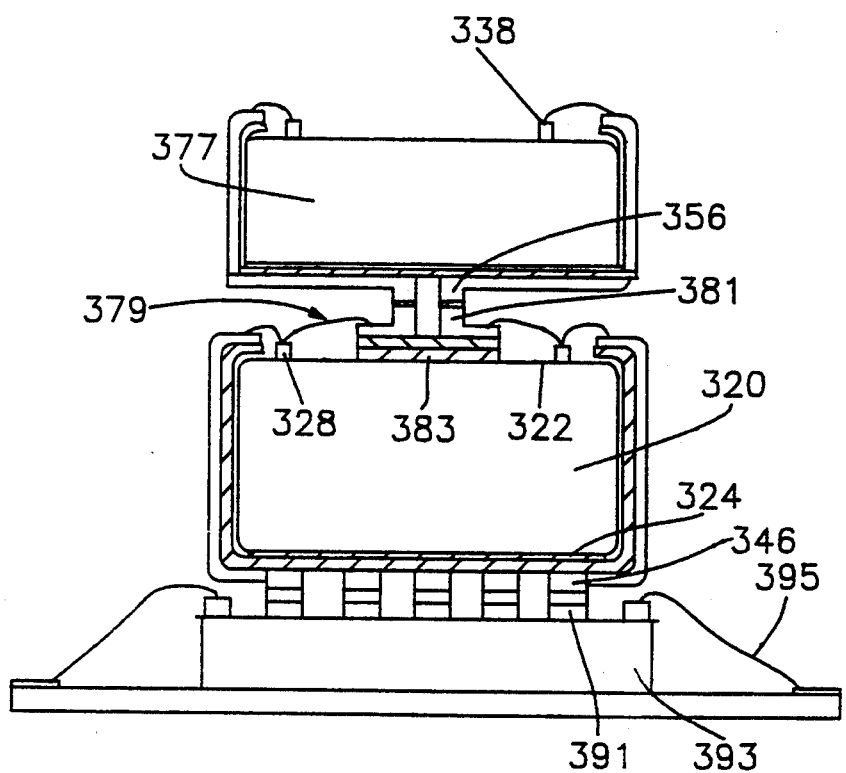
FIGS. 11 and 12 are diagrammatic sectional views depicting still further embodiments.

As illustrated in FIG. 11, a sub-assembly in accordance with the present invention may be mounted on another chip. For example, as illustrated in FIG. 11 contacts 328 on the front surface 322 of chip 320 are connected, through terminals 346, to contacts 391 of a semiconductor chip 393. Thus, chip 393 itself serves as the substrate for mounting the assembly incorporating chip 320. Chip 393 in turn is connected via conventional wire bond leads 395 to a further substrate and hence to other electronic elements. Conversely, a further chip 377 is mounted so as to overlie the front surface of chip 320. An interposer 379 is disposed on chip front surface 322. This interposer has terminals 381 connected to some of the contacts 328 on the chip front surface via flexible leads. The interposer itself is flexible and includes a compliant layer 383 disposed between terminals 381. Those terminals in turn are connected to terminals 356 of a further sub-assembly, which in turn are connected to contacts 338 of chip 377. Thus, all of chips 320, 393 and 377 are interconnected in a stacked circuit sub-assembly.

The interposer 379 shown in FIG. 11 may be of the types described in our prior, copending application Ser. Nos. 07/673,020 and 07/586,758. Briefly, these interposers provide terminals, such as terminals 381, overlying the front surface of a semiconductor chip and connected to contacts on the chip. Most preferably, the leads interconnecting the terminals of the interposer and the contacts on the chip are flexible, and the interposer itself desirably is flexible. Also, the terminals on the interposer are moveable in directions towards the front face of the chip. Resilient means such as complaint layer 383 provides resilient resistance to such movement. Thus, the assembly of the interposer 379 and chip 320 can be tested using a multiple probe or multiple pin test fixture in substantially the same way as discussed above with regard to FIG. 8.

In this regard, the most preferred interposer assemblies in accordance with our prior copending applications and the most preferred assemblies including backing elements as discussed above herein share certain significant common characteristics. Thus, both have terminals mounted on a generally sheet-like element so that the terminals overlie a major surface of a semiconductor chip, i.e., the front or the back surface. In both cases, the terminals are moveable towards or away from the chip and resilient means are provided for resisting movement towards the chip. Also, the sheet-like element (the interposer or backing element) preferably is flexible, as are the leads interconnecting the terminals with the contacts on the chip. This provides for movement of the terminals on the sheet-like element relative to the chip contacts, allowing for take up of a differential thermal expansion between the chip and other structures to which the terminals on the sheet-like element are connected.

Figure 12:
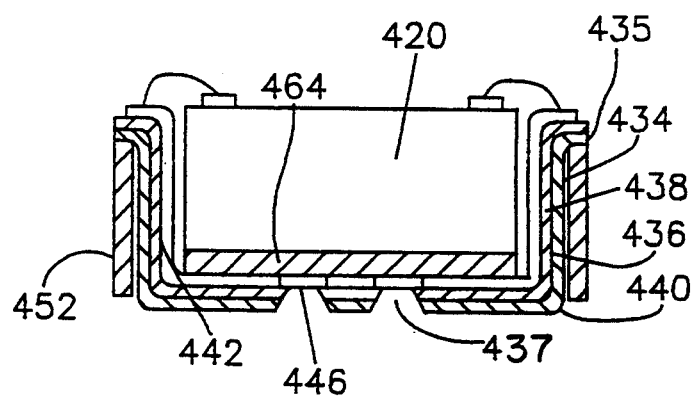

In an assembly according to a further embodiment of the invention, illustrated in FIG. 12, the orientation of the sheet-like connection component is reversed. That is, the lead-bearing or first surface 442 faces toward chip 420. Terminals 446 are exposed through holes 473 extending through the insulating layers 440 and 438. The conductive layer 436 disposed between these insulating layers terminates remote from holes 473, so that the two insulating layers merge with one another at the boundaries of the holes and insulate the holes from layer 436. Thus, bonding material can be introduced in holes 437 so as to connect terminals 446 to a substrate. Also in this arrangement, the extremities 435 of flaps 434 are bent outwardly, away from the chip, and the walls or support elements 452 are disposed outside of the flaps. That is, the flaps lie between support elements 452 and the chip. Compliant layer 464 immediately underlies terminals 446.

In a further variant (not shown) the support elements or walls can be integral with the connecting element, and particularly can be integral with the flaps. Thus, the connecting element can have relatively stiff regions constituting the flaps and a flexible region constituting the central or backing element. The stiff regions constituting the flaps can be bent upwardly so as to form a self-supporting structure. As in the arrangement discussed above, this provides a generally box-like or cup-like structure having an open top with lead portions disposed around the periphery of the opening for receiving a chip and connecting thereto.

As will be readily appreciated, numerous further variations and combinations of the features discussed above can be utilized without departing from the present invention as defined by the claims. In one such variant (not shown) the backing element is provided substantially as illustrated in FIGS. 1–8, but the flaps and the lead portions on the flaps are omitted. In this arrangement, the bonding wires constitute the principal portion of each lead. The bonding wires extend downwardly, alongside the edges of the chip, to the backing element and join the backing element adjacent the rear or bottom face of the chip. In this arrangement, the bonding wires constitute the leads extending alongside the edges of the chip. This arrangement is distinctly less preferred because it does not offer the same degree of control over lead impedance as the other arrangements discussed above. However, it does provide many of the other advantages of the more preferred embodiments. Thus, the foregoing descriptions of the preferred embodiments should be taken by way of illustration rather than by way of limitation of the invention as defined in the claims.

What is claimed is:

1. A semiconductor chip assembly comprising:
   (a) a semiconductor chip having oppositely-facing front and rear surfaces, edges extending between said front and rear surfaces and contacts on said front surface;
   (b) a generally sheetlike backing element underlying said chip, said backing element having a top surface facing toward the rear surface of said chip and a bottom surface facing away from said chip, said backing element having a central region aligned with said chip, said backing element also having terminals thereon, at least some of said terminals being disposed on said bottom surface in said central region of said backing element; and
   (c) electrically conductive interconnecting said contacts on said chip front surface and said terminals on said backing element bottom surface, said leads extending alongside said edges, said backing element and leads being flexible so that said terminals on said backing element are moveable with respect to said chip, said chip assembly further comprising at least one generally sheet-like, flexible flap connected to said backing element, each said flap extending upwardly alongside one edge of said chip, each said lead including a flap portion extending along one said flap.

2. A chip assembly as claimed in claim 1 including a plurality of said flaps.

3. A chip assembly as claimed in claim 1 wherein said contacts on said chip include at least one elongated row extending adjacent one said edge, each said flap extending to the vicinity of one said row.

4. A chip assembly as claimed in claim 3 wherein each said lead includes a wire extending between one said contact on said chip and the flap portion of the lead.

5. A chip assembly as claimed in claim 3 wherein each said flap extends inwardly onto the front surface of said chip and overlies a row of said contacts.

6. A chip assembly as claimed in claim 5 wherein each said flap includes a slot aligned with a row of said contacts, the flap portion of each said lead extending across the slot in the associated flap and being bonded to one of said contacts in said slot.

7. A chip assembly am claimed in claim 5 wherein each said flap includes holes aligned with contacts on said chip, the flap portion of each of said leads being connected to one of said contacts through one of said holes.

8. A chip assembly as claimed in claim 1 wherein each said flap includes an electrically conductive layer and a dielectric layer disposed between said electrically conductive layer and said flap portions of said leads.

9. A chip assembly as claimed in claim 8 wherein said backing element includes an electrically conductive layer and a dielectric layer, each said lead including a backing element portion extending along said backing element between the flap portion of such lead and one of said terminals, said dielectric layer of said backing element being disposed between the conductive layer of the backing element and said backing portions of said leads.

10. A chip assembly as claimed in claim 9 wherein said backing element and said at least one flap are formed integrally with one another.

11. A chip assembly as claimed in claim 1 further comprising at least one support element, each said support element being disposed between one said flap and one edge of said chip.

12. A chip assembly as claimed in claim 11 wherein said at least one flap includes a plurality of flaps and said at least one support element includes a plurality of support elements, said plural support elements being connected to one another and cooperatively defining a unitary ring encircling said chip.

13. A chip assembly as claimed in claim 12 further comprising a generally planar floor element extending between said support elements beneath said chip, said floor element being connected to said support elements so that said floor element and said support elements cooperatively define a box-like structure with said support elements constituting the walls of the box-like structure, said chip being disposed within said box-like structure, said backing element and flaps being disposed on the outside of said box-like structure.

14. A chip assembly as claimed in claim 13 further comprising projections extending downwardly from said floor element adjacent the intersections of said floor element and said support elements, said backing element being spaced apart from said floor element and extending over said downward projections.

15. A chip assembly as claimed in claim 13 wherein said backing element includes a layer of a compliant material disposed between said floor element and said terminals.

16. A semiconductor chip assembly comprising:
(a) a semiconductor chip having oppositely-facing front and rear surfaces, edges extending between said front and rear surfaces and contacts on said front surface;
(b) a generally sheetlike backing element underlying said chip, said backing element having a top surface facing toward the rear surface of said chip and a bottom surface facing away from said chip, said backing element having a central region aligned with said chip, said backing element also having terminals thereon, at least some of said terminals being disposed on said bottom surface in said central region of said backing element; and
(c) electrically conductive leads interconnecting said contacts on said chip front surface and said terminals on said backing element bottom surface, said leads extending alongside said edges, said backing element and leads being flexible so that said terminals on said backing element are moveable with respect to said chip.

said terminals on said backing element being movable towards said bottom surface of chip, the assembly including resilient means for opposing movement of said terminals towards said bottom surface.

17. A chip assembly as claimed in claim 16 wherein said resilient means includes a layer of a compliant material disposed between said chip rear surface and said terminals.

18. A semiconductor chip assembly comprising:
(a) a semiconductor chip having oppositely-facing front and rear surfaces, edges extending between said front and rear surfaces and contacts on said front surface;
(b) a generally sheetlike backing element underlying said chip, said backing element having a top surface facing toward the rear surface of said chip and a bottom surface facing away from said chip, said backing element having a central region aligned with said chip, said backing element also having terminals thereon, at least some of said terminals being disposed on said bottom surface in said central region of said backing element; and
(c) electrically conductive leads interconnecting said contacts on said chip front surface and said terminals on said backing element bottom surface, said leads extending alongside said edges, said backing element and leads being flexible so that said terminals on said backing element are moveable with respect to said chip, said chip assembly further comprising a substrate having a top surface facing said backing element and a plurality of connection pads disposed on said top surface, said terminals on said backing element and said connection pads on said top surface being disposed in corresponding patterns so that one said terminal is aligned with each one of said connection pads, the assembly additionally comprising means for connecting said connection pads on said substrate to said terminals on said backing elements.

19. An assembly as claimed in claim 18 wherein said means for connecting includes masses of an electrically conductive bonding material, one said mass being disposed between each said terminal and the contact pad aligned therewith.

20. A semiconductor chip assembly comprising:
(a) a semiconductor chip having oppositely-facing front and rear surfaces, edges extending between said front and rear surfaces and contacts on said front surface;
(b) a generally sheetlike backing element underlying said chip, said backing element having a top surface facing toward the rear surface of said chip and a bottom surface facing away from said chip, said backing element having a central region aligned with said chip, said backing element also having terminals thereon, at least some of said terminals being disposed on said bottom surface in said central region of said backing element; and
(c) electrically conductive leads interconnecting said contacts on said chip front surface and said terminals on said backing element bottom surface, said leads extending alongside said edges, said backing element and leads being flexible so that said terminals on said backing element are moveable with respect to said chip, said chip assembly further comprising means for transferring heat from said front surface of said chip.

21. A chip assembly as claimed in claim 20 wherein said heat transferring means includes a thermally conductive pad in contact with said front surface of said chip.

22. A chip assembly as claimed in claim 21 further comprising a dielectric encapsulant overlying at least the front surface of said chip.

23. A component semiconductor chip comprising
(a) a flexible sheetlike backing element having a top surface, a bottom surface and a plurality of terminals on said bottom surface, the direction from said bottom surface to said top surface being the upward direction;
(b) at least one support element projecting upwardly from said backing element, each said support element having a top edge remote from said backing element; and
(c) a plurality of leads connected to said terminals and extending upwardly alongside at least one said support element, said at least one support element including a plurality of walls defining a box having a top and a bottom, said backing element being positioned adjacent the bottom of said box, said leads extending upwardly toward the top of the box, said box being open at the top whereby a semiconductor chip may be inserted into the box.

24. A component as claimed in claim 23 further comprising a plurality of generally sheet-like flaps extending upwardly from said backing element alongside said walls, said leads extending along said flaps.

25. A component as claimed in claim 23, further comprising means for providing an electrically conductive surface extending substantially parallel to each said flap.

26. A component as claimed in claim 25 wherein said means for providing an electrically conductive surface includes an electrically conductive layer incorporated in each said flap.

27. A component as claimed in claim 23 further comprising a compliant layer overlying said backing element within said box.

* * * * *

UNITED STATES PATENT AND TRADEMARK OFFICE
CERTIFICATE OF CORRECTION

PATENT NO. : 5,347,159

DATED : September 13, 1994

INVENTOR(S) : Khandros et al

It is certified that error appears in the above-identified patent and that said Letters Patent is hereby corrected as shown below:

On cover page, inventor "Thomas H. Distefano" should be -- Thomas H. DiStefano --.

Column 17, line 4, "am claimed" should read -- as claimed --.

Column 19, line 14, after the word "component" insert the words -- for mounting a --; and after the word "comprising" delete the comma (,) and insert a colon --:--.

Signed and Sealed this

Twenty-eight Day of February, 1995

Attest:

BRUCE LEHMAN

*Attesting Officer*     *Commissioner of Patents and Trademarks*